US009735038B2

United States Patent
Gondcharton et al.

(10) Patent No.: US 9,735,038 B2
(45) Date of Patent: Aug. 15, 2017

(54) PROCESS FOR MANUFACTURING A SEMICONDUCTOR STRUCTURE WITH TEMPORARY BONDING VIA METAL LAYERS

(71) Applicant: COMMISSARIAT A L'ENERGIE ATOMIQUE ET AUX ENERGIES ALTERNATIVES, Paris (FR)

(72) Inventors: Paul Gondcharton, Grenoble (FR); Lamine Benaissa, Massy (FR); Anne-Marie Charvet, Vif (FR); Bruno Imbert, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/910,553

(22) PCT Filed: Aug. 4, 2014

(86) PCT No.: PCT/EP2014/066703
§ 371 (c)(1),
(2) Date: Feb. 5, 2016

(87) PCT Pub. No.: WO2015/018784
PCT Pub. Date: Feb. 12, 2015

(65) Prior Publication Data
US 2016/0189995 A1 Jun. 30, 2016

(30) Foreign Application Priority Data

Aug. 5, 2013 (FR) ..................................... 13 57775

(51) Int. Cl.
*H01L 21/683* (2006.01)
*H01L 27/06* (2006.01)
(Continued)

(52) U.S. Cl.
CPC .... *H01L 21/6835* (2013.01); *H01L 21/76898* (2013.01); *H01L 27/0688* (2013.01);
(Continued)

(58) Field of Classification Search
CPC ........... H01L 21/76898; H01L 27/0688; H01L 21/6835
(Continued)

(56) References Cited

U.S. PATENT DOCUMENTS 3,714,702 A * 2/1973 Hammond ............. B23K 35/32
228/122.1
8,363,330 B2 1/2013 Bolis et al.
(Continued)

OTHER PUBLICATIONS

U.S. Appl. No. 14/893,396, filed Nov. 23, 2015, Bruno Imbert, et al.
(Continued)

*Primary Examiner* — Moazzam Hossain
*Assistant Examiner* — Omar Mojaddedi
(74) *Attorney, Agent, or Firm* — Oblon, McClelland, Maier & Neustadt, L.L.P.

(57) ABSTRACT

A method for manufacturing a structure implementing temporary bonding a substrate to be handled with a handle substrate, including: providing the substrate to be handled covered with a first metal layer, the first layer having a first grain size; providing the handle substrate covered with a second metal layer, the second layer having same composition as the first metal layer and a second grain size different from the first grain size; assembling the substrate to be handled and the handle substrate by thermocompression assisted direct bonding on the first and second metal layers; possibly treating the substrate to be handled assembled to the handle substrate; disassembling the assembly of the substrate to be handled and the handle substrate to form the structure, including an embrittlement thermal annealing of
(Continued)

the assembly resulting in the handle substrate being detached.

18 Claims, 4 Drawing Sheets

(51) Int. Cl.
*H01L 21/48* (2006.01)
*H01L 21/768* (2006.01)
*H01L 23/498* (2006.01)
*H01L 25/065* (2006.01)
*H01L 23/00* (2006.01)

(52) U.S. Cl.
CPC ...... *H01L 21/486* (2013.01); *H01L 23/49827* (2013.01); *H01L 24/16* (2013.01); *H01L 24/81* (2013.01); *H01L 25/0655* (2013.01); *H01L 2221/6834* (2013.01); *H01L 2221/68318* (2013.01); *H01L 2221/68327* (2013.01); *H01L 2221/68331* (2013.01); *H01L 2221/68363* (2013.01); *H01L 2221/68381* (2013.01); *H01L 2224/16225* (2013.01); *H01L 2224/16235* (2013.01); *H01L 2224/81005* (2013.01); *H01L 2224/81192* (2013.01); *H01L 2924/15311* (2013.01)

(58) Field of Classification Search
USPC .................................. 438/107, 455; 428/212
See application file for complete search history.

(56) References Cited

U.S. PATENT DOCUMENTS

| | | | |
|---|---|---|---|
| 9,014,810 B2 | 4/2015 | Sauter-Starace et al. | |
| 2004/0121516 A1 | 6/2004 | Yamazaki et al. | |
| 2006/0220211 A1 | 10/2006 | Yamazaki et al. | |
| 2007/0051624 A1* | 3/2007 | Okabe | C22C 9/06 204/298.13 |
| 2009/0038758 A1* | 2/2009 | Legros | H01L 21/187 156/718 |
| 2010/0044830 A1* | 2/2010 | Cayrefourcq | H01L 21/76254 257/506 |
| 2010/0081280 A1 | 4/2010 | Moriceau et al. | |
| 2011/0169030 A1* | 7/2011 | Li | H01L 33/22 257/98 |
| 2012/0034437 A1 | 2/2012 | Puligadda et al. | |
| 2012/0034758 A1* | 2/2012 | Koezuka | H01L 21/324 438/458 |
| 2012/0061841 A1* | 3/2012 | Yamaguchi | H01L 21/8221 257/761 |
| 2012/0231608 A1* | 9/2012 | Shibata | H01L 21/0242 438/458 |
| 2013/0029474 A1* | 1/2013 | Gaudin | H01L 21/76254 438/458 |
| 2013/0111719 A1 | 5/2013 | Deguet et al. | |
| 2013/0133936 A1* | 5/2013 | Yorita | H05K 1/09 174/257 |
| 2013/0203205 A1* | 8/2013 | Murali | H01L 27/14632 438/70 |
| 2013/0214292 A1* | 8/2013 | Kazama | H01L 33/02 257/79 |
| 2013/0284353 A1* | 10/2013 | Brainard | B32B 38/10 156/247 |
| 2014/0174627 A1 | 6/2014 | Puligadda et al. | |
| 2014/0217593 A1* | 8/2014 | Chen | H01L 24/05 257/762 |
| 2014/0342504 A1* | 11/2014 | Sakai | H01L 21/76254 438/108 |
| 2015/0243615 A1* | 8/2015 | Liang | H01L 23/49827 257/737 |

OTHER PUBLICATIONS

U.S. Appl. No. 14/901,027, filed Dec. 27, 2015, Thomas Signamarcheix, et al.

Paul Gondcharton, et al., "Mechanisms of Thermocompression Process for Copper Metal Bonding," 2013 MRS Spring Meeting, 2013, 10 pages.

Bahareh Banijamali, et al., "Advanced Reliability Study of TSV Interposers an Interconnects for the 28nm Technology FPGA," 2011 Electronic Components and Technology Conference, 2011, 6 pages.

International Search Report Issued Sep. 1, 2014 in PCT/EP14/66703 Filed Aug. 4, 2014.

French Search Report Issued Apr. 9, 2014 in FR 1357775 Filed Aug. 5, 2013.

\* cited by examiner

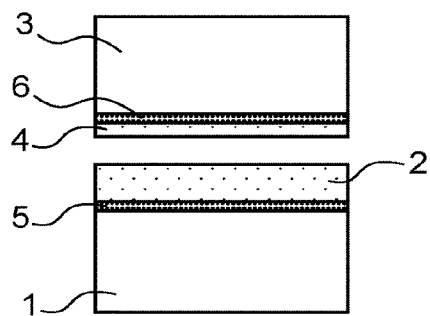
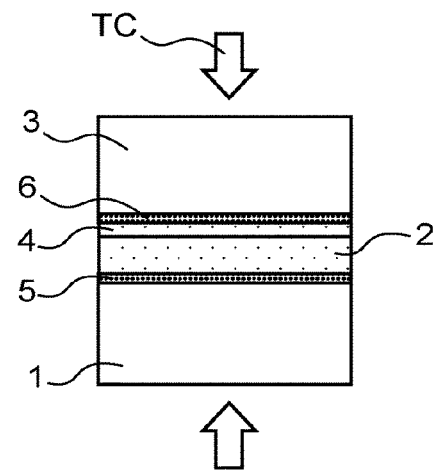
FIG. 1a
FIG. 1b
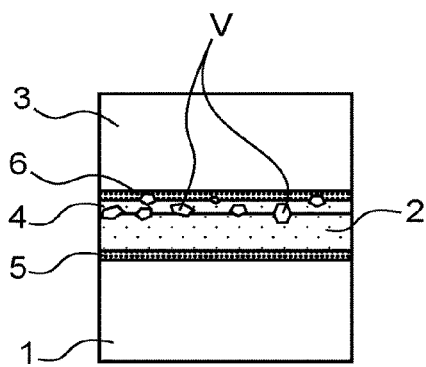
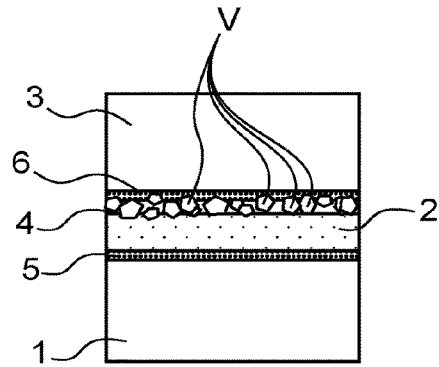
FIG. 1c
FIG. 1d

PROCESS FOR MANUFACTURING A SEMICONDUCTOR STRUCTURE WITH TEMPORARY BONDING VIA METAL LAYERS

TECHNICAL FIELD

The field of the invention is that of making structures, in particular semiconductor structures, using temporary bonding of a substrate to another.

Possible applications of such structures are found in all the fields of microtechnology, in particular for homogeneous or heterogeneous 3D integration for which it is attempted to stack and then seal electronic chips, microelectromechanical systems (MEMS), power, photonic and photovoltaic components.

STATE OF PRIOR ART

During the manufacture of such structures, used in particular in microelectronics, the need to have to handle thin layers causes handling problems for the substrates. In particular, if the plate is less than 150 μm in thickness, it cannot be handled by conventional means (such as manually, by vacuum pipettes, by pliers, by robots, etc.) with the risk to be cracked or even to be cleaved. Actually, the substrates for these thicknesses have no mechanical strength (much like a paper sheet to be compared with a paperboard sheet).

A solution to this problem consists in making temporary bonding of the substrate to be handled to a handle substrate according to a sequence having:

- a bonding step which enables a temporary handle substrate to be assembled to the substrate to be handled on which it is desired, for example, to make specific technological steps and/or the conventional handling of which is problematic;
- a disassembling step which enables this handle substrate to be separated from the assembly to leave free the substrate to be handled for a future integration.

Such a temporary bonding can be made by an oxide-oxide molecular bonding or even using a polymeric adhesive.

In the first case, the bonding energy of an oxide-oxide bonding only increases with the temperature which makes it impossible to disassemble the assembly beyond some thermal budget applied. In other words, the handle substrate does not become a temporary substrate any longer but a sacrificial substrate required to be consumed (for example, through mechanical and/or chemical lapping).

To overcome this problem, techniques consist in including thermally "embrittlable" layers in the stack. These layers, for example porous layers or ionically implanted layers, allow for the disassembly but cause a loss of materials and further production costs.

In the second case, the polymeric adhesive materials employed can become unstable with temperature, for example from 150° C. In addition, because of their mechanical properties, the polymers can deform under the effect of some methods (for example, because of the pressure introduced during a thermocompression assembly) and can lead to variations in thickness of some tens of microns likely to raise a problem of uniformity for the treatments applied to the substrates to be handled. The organic nature of this type of material also raises cleanliness problems (for example, degassing in the equipment chambers, contamination of the polishing disks). And in practice, the disassembly through dissolution of the polymer is not easy for plates having a large diameter.

DISCLOSURE OF THE INVENTION

The invention aims at coping with these drawbacks of the temporary bonding techniques of the state of the art. For this, it provides a method for manufacturing a structure implementing temporary bonding a substrate to be handled with a handle substrate, characterised in that it includes the following steps of:

- providing the substrate to be handled covered with a first metal layer, the first layer having a first grain size;
- providing the handle substrate covered with a second metal layer, the second layer having the same composition as the first metal layer and a second grain size different from the first grain size;
- assembling the substrate to be handled and the handle substrate by thermocompression assisted direct bonding of the first and second metal layers;
- possibly treating the substrate to be handled while assembled to the handle substrate;
- disassembling the assembly of the substrate to be handled and the handle substrate to form the structure, said disassembling comprising an embrittlement thermal annealing of said assembly resulting in the handle substrate being detached.

Some preferred but in no way limiting aspects of the method are the following ones:

- the first and second grain sizes differ by a factor at least equal to 5, preferentially at least equal to 10, even more preferentially at least equal to 50;
- the first metal layer has a thickness different from the second metal layer, the ratio between the thicknesses being for example at least equal to 5;
- the deposition of the first and second metal layers on the handle substrate and the substrate to be handled respectively is made according to different operating conditions;
- it comprises before assembling the substrate to be handled and the handle substrate, implementing different crystallization annealings of the substrate to be handled covered with the first metal layer and of the handle substrate covered with a second metal layer;
- it comprises, before assembling the substrate to be handled and the handle substrate, a surface roughening treatment applied to at least one of the first and second metal layers;
- the first metal layer is a discontinuous layer consisting of a plurality of metal micro-bumps distributed on the substrate to be handle, the first grain size being higher than the second grain size;
- it comprises, after the handle substrate is detached, withdrawing the residues of the first and second metal layers present on the substrate to be handled;
- the metal layer being of copper, the treatment of the substrate to be handled while assembled to the handle substrate is made at a temperature higher than 200° C. and lower than the embrittlement thermal annealing temperature of the assembly;
- the metal layer being of copper, the embrittlement thermal annealing of the assembly is made at a temperature higher than or equal to 400° C.;
- the metal layers being of a refractory metal, the embrittlement thermal annealing of the assembly is made at a temperature higher than or equal to 900° C.;

the embrittlement annealing of the assembly is a defect nucleation and growth thermal treatment, said nucleation and growth being promoted on the side of that of the first and second metal layers which has the lowest grain size;

the treatment of the substrate to be handled while assembled to the handle substrate can comprise assembling to a receiver substrate.

the treatment of the substrate to be handled while assembled to the handle substrate can comprise, before assembling to a receiver substrate, thinning the free face of the substrate to be handled and forming through-silicon vias passing through the thinned substrate to be handled.

BRIEF DESCRIPTION OF DRAWINGS

Further aspects, purposes, advantages and characteristics of the invention will better appear upon reading the following detailed description of preferred embodiments thereof, given by way of non-limiting examples, and made in reference to the appended drawings in which:

FIGS. 1a-1d are schemes illustrating the different steps of a first possible embodiment of the method according to the invention;

DETAILED DISCLOSURE OF PARTICULAR EMBODIMENTS

Figure 2:
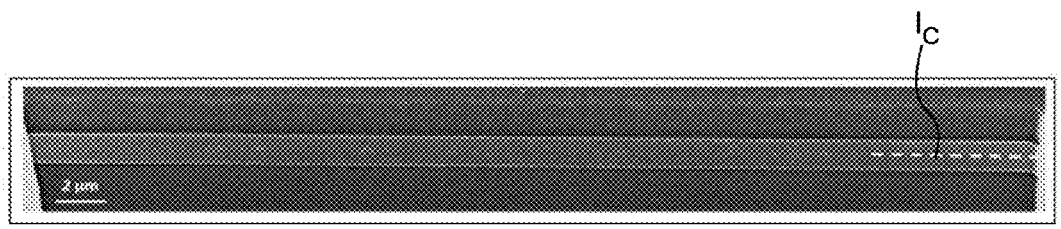
FIG. 2 is a cross-section view of a bonding interface between two copper layers having the same grain size.

The invention relates to a method for manufacturing a semiconductor structure while implements temporarily bonding a substrate to be handled with a handle substrate.

This method will be first described with reference to FIGS. 1a-1d which illustrate a first possible embodiment thereof.

With reference to FIG. 1a, this method comprises a step of providing the substrate to be handled 1 covered with a first metal layer 2, the first layer having a first grain size. Within the scope of this first embodiment, the first metal layer 1 is continuous in that it covers the entire surface of the substrate to be handled 1.

By grain size, it is meant in this document the mean radius of the circle inscribed in the grain along the plane of the substrate.

Still in reference to FIG. 1a, the method further includes a step of providing the handle substrate 3 covered with a second metal layer 4, the second layer having a composition identical to the first layer (identical metal) and a second grain size different from the first grain size. The second layer 2 is also continuous.

The first and second metal layers 2, 4 can be copper layers, which turns out to be advantageous given that this material is largely present on microelectronic production lines. Metal layers 2, 4 of gold, aluminium, molybdenum, tungsten, etc. can also be used, in order to widen permissible temperature ranges for the methods.

The first and second metal layers 2, 4 are respectively preferably formed on first and second tie sub-layers 5, 6 interposed between the substrate to be handled 1 and the first metal layer 2 on the one hand and between the handle substrate 3 and the second metal layer 4 on the other hand. These tie sub-layers enable metal layers to be deposited.

The tie sub-layers 5, 6 are for example made of silicon oxide $SiO_x$, silicon nitride $SiN_x$, titanium Ti, titanium nitride TiN, tantalum Ta, tantalum nitride TaN, or tungsten nitride WN. Preferably, tie sub-layers further forming a metal diffusion barrier are chosen in order to counteract the diffusion of material of the metal layers 2, 4 into the substrates 1, 3, in particular during subsequent thermal treatment steps. By way of illustrating examples, a barrier layer of titanium nitride or tantalum nitride can be interposed between a silicon substrate and a copper metal layer to prevent copper from being diffused into silicon.

A tie metal diffusion barrier sub-layer of titanium nitride can be formed by metal organic chemical vapour deposition (MOCVD), in particular on a thermal oxide layer present at the surface of the substrate to be handled or the handle substrate. For example, a sub-layer 5, 6 with a thickness of 20 nm is formed on a thermal oxide of 500 nm.

The first and second metal layers 2, 4 can be formed by physical vapour deposition (PVD) of a copper seed layer, for example with a thickness of 200 nm. A copper electrochemical deposition (ECD) can then be conducted on the seed layer if the thickness of the copper layer is desired to be increased.

A recrystallization annealing, for example at 400° C., can be made in order to stabilize the microstructure of the metal layers 2, 4 deposited onto the substrate to be handled 1 and onto the handle substrate 3, respectively.

Within the scope of the present invention, the first metal layer 2 and the second metal layer do not have the same grain size. The first and second grain sizes preferentially differ by a factor at least equal to 5, more preferentially at least equal to 10, even more preferentially at least equal to 50. Thereby, it can be decided that one of the first and second grain sizes is between 20 nm and 100 nm, whereas the other of the first and second grain sizes is between 5 μm and 10 μm.

The first grain size can be higher than the second grain size. Thus, as will be detailed in the following, the subsequent detachment of the handle substrate is mainly operated on the side of the second metal layer 4, more particularly at the sub-layer 6/second metal layer 4 interface. This enables the handle substrate to be more easily recycled. It is also possible that the first grain size is lower than the second grain size. In this case, the number of operations on the substrate to be handled is limited.

The asymmetry of the grain sizes between the metal layers 2, 4 can be induced by an asymmetry of thickness between these layers 2, 4, which is obtained for example by providing a longer duration of electrochemical deposition ECD for one of these layers. The grains of a thick layer are actually coarser than those of a thin layer. A ratio at least equal to 5 between the thicknesses of the layers 2, 4 is preferably provided. By way of illustrating examples, a first metal layer 2 with a thickness of 5 μm and a second metal layer 4 with a thickness of 50 nm can be provided. The first grain size is then in the order of 5 to 10 μm, whereas the second grain size is in the order of 50 to 100 nm.

The asymmetry in the grain sizes between the metal layers 2, 4 can also be achieved by making the deposition of the first and second metal layers on the handle substrate and the substrate to be handled respectively according to different operating conditions. By way of example, the temperature of the substrate during the deposition of the seed layer can be modified. Or even, the nature of the electrolytic bath during the ECD deposition can be modified.

The asymmetry in the grain sizes between the metal layers 2, 4 can also be achieved via the above-mentioned crystallization annealing, which as a function of the thermal budget applied (temperature-duration couple) can enable the grain size to be increased in a plane. Thereby, different crystallization annealings can be applied to the substrate to be handled covered with the first metal layer and to the substrate to be handled covered with a second metal layer.

It is of course possible to combine all these techniques (thickness dissymmetry, deposition and/or annealing conditions) to adjust the respective grain sizes of both metal layers.

With reference to FIG. 1b, the method then includes a step of assembling the substrate to be handled 1 and the handle substrate 3 by thermocompression TC assisted direct bonding of the first and second metal layers 2, 4.

The thermocompression assisted bonding technique enables, by simultaneously applying a thermal budget and a uniaxial pressure on either side of the assembly, interfaces to be sealed without any surface preparation after depositing the metal layers. In this regard, the article by P. Gondcharton et al. entitled "Mechanisms Overview of Thermocompression Process for Copper Metal Bonding", MRS Proceedings 2013 could be referred to.

As a result of the assembly under thermocompression, crystal defects (dislocations, vacancies, etc.) are found built up at a high density in the bonding layers. These defects are invisible at this stage because they are homogeneously distributed in the bonding layers. It can be thought that the uniaxial pressure applied to the assembly leads to a plastic deformation of the metal layers, this plastic deformation being accompanied by the creation of crystal defects.

In a possible embodiment of the invention, the surface of one and/or the other of the bonding metal layers 2, 4 can be subjected before assembling to a surface roughening treatment. The plastic deformation that occurs upon bonding rough surfaces is actually higher, which increases the density of crystal defects.

Likewise, a longer thermocompression under a higher pressure can be promoted. The increase in both parameters (at a constant temperature) actually promotes the plastic deformation of the metal bonding layers and potentially increases the density of crystal defects.

In an exemplary embodiment, this assembly is made at 250° C. for 10 h under a pressure of 50 kN (1.75 MPa). More generally, the assembly is made with a temperature between 200 and 300° C., for a duration of 2 to 10 hours and a force between 50 and 100 kN for a structure with a diameter of 200 mm.

In FIG. 2 a cross-section view is represented obtained by focused ion beam scanning electron microscopy (FIB-SEM) on a window with a width of 40 μm of the bonding interface Ic between two copper layers of 1 μm having the same grain size. The assembly resists to the mechanical thinning up to a thickness of 4 μm of residual silicon.

Figure 3:
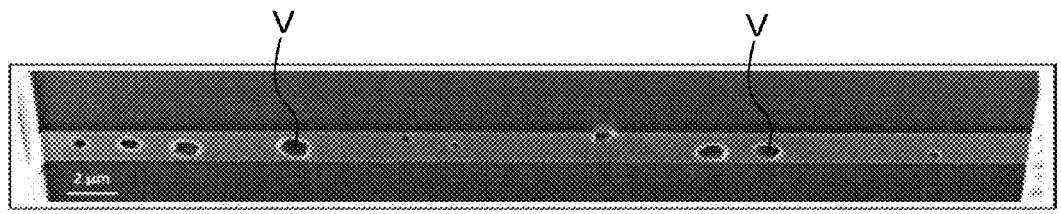
FIG. 3 is a cross-section view of the bonding interface of FIG. 2 after an annealing at 400° C. for 1 hour.

FIG. 3 in turn illustrates a FIB-SEM cross-section on a window of 40 μm of width of this same bonding interface after applying an annealing at 400° C. for 1 hour (with ramps of 1.7° C./min). It can be noticed that the annealing leads to the nucleation and growth of defects V of a few hundred nanometers of diameter at the bonding layers (called facetted morphology voids thereafter, as in the above-mentioned article). It will be noticed that this annealing, applied to metal bonding layers having the same grain size, does not result to both substrates being detached.

Following bonding, the method according to the invention can comprise one or more steps of treating the substrate to be handled, then assembled to the handle substrate (for example manufacturing microelectronic circuits, thinning, assembling to a final receiver substrate, etc.). In the case of metal layers of copper, gold or aluminium, these possible treatments can in particular be performed in a temperature range between 30 and 350° C. which covers currently used temperatures for conventional CMOS ("Complementary metal-oxide-semiconductor") methods, MEMS, etc. especially at temperatures (in particular beyond 200° C.) which cannot benefit from a polymeric temporary bonding because of its lack of temperature stability, or which lead to a too high adhesion of an oxide-oxide bonding to allow an easy disassembly. In the case of metal layers of a refractory metal (molybdenum or tungsten for example), these possible treatments can reach temperatures of 900° C., or even higher.

It will be reminded besides that the mechanical properties of the thin metal layers allow the flatness of the assembly to be held during treatments resulting in mechanical biases (in particular in compression and shearing) of the interface. Mechanical thinnings of the substrate to be handle up to 3 μm of residual silicon can in particular be made without flatness loss.

With reference to FIGS. 1c and 1d, the method according to the invention comprises a step of disassembling the assembly of the substrate to be handled and the handle substrate to form the structure, said disassembly comprising an embrittlement thermal annealing of said assembly resulting in the handle substrate to be detached. The embrittlement thermal annealing of said assembly is a defect nucleation and growth thermal treatment, said nucleation and growth being promoted on the side of that of the first and second metal layers which has the lowest grain size.

This thermal annealing actually leads to the reorganization of the crystal defects and the agglomeration thereof in energetically favourable sites, to give rise to the facetted morphology void type vacancies V. As can be seen in FIG. 1c, these sites are typically triple points of grain boundaries, or interfaces with a lesser energy (bonding interface or sub-layer/metal deposition interface).

Visible, facetted and with sufficiently high dimensions, these reorganized defects will allow the adhesion loss between both substrates. More precisely, the nucleation and growth of voids V are promoted on the side of that of the first and second metal layers which has the lowest grain size. As illustrated in FIG. 1d, making an asymmetric bonding in grain size actually enables, during the embrittlement thermal annealing, preferential nucleation and growth of the vacancies V at the sub-layer/metal layer interface having the smallest grains (in FIGS. 1a-1d, the second metal layer 4 with the lowest thickness) where the density of the preferential sites is very high.

Thus, by varying the microstructure of the metal layers to be bonded, the invention enables the phenomenon of forming the facetted morphology voids V to be promoted and controlled, so as to enable an embrittled zone to be formed between the substrates 1, 2, or even an adhesion loss of the substrates 1, 2, in particular an adhesion loss at the sub-layer 6/metal layer 4 interface including the smallest grains. To achieve this adhesion loss, the voids have to be in a sufficient quantity and localized enough in a plane parallel to the plane of the structure. For this, the cumulative metal thickness in both metal layers has to be sufficient (typically higher than 300 nm in the case of copper). This thickness can however be reduced when specific preparations are made to promote development of these voids (in particular by roughening before bonding).

Advantageously, to promote the location of the voids at the sub-layer 6/metal layer 4 interface, for the layer 4, a reduced thickness with respect to the layer 2 will be chosen, advantageously at least 5 times smaller. The thicker layer thereby acts as a "reserve" of defects. For example, a copper layer 4 with a thickness of 50 nm and a copper layer 2 with a thickness of 250 nm could be assumed.

In the case of copper, gold or aluminium, this thermal treatment leading to the decrease in the bonding energy up to the adhesion loss of both substrates can be made at a temperature higher than or equal to 400° C., for example for a duration of at least ten minutes and at most two hours.

In the case of refractory metals, this thermal treatment can be made at a temperature higher than 900° C. for one to two hours for example.

Of course, during the previous steps of the method (thermocompression and possible treatments applied to the substrate to be handled then assembled to the handle substrate), the overall thermal budget applied remains lower than that applied during the detachment annealing of the handle substrate, the temperature remaining the prevailing factor.

A mechanical action (for example inserting a blade) can possibly be applied before or after the thermal treatment leading to the decrease in the bonding energy to achieve a full detachment. This step remains optional because the detachment can be achieved simply by thermal treatment.

Following the detachment of the handle substrate, the method can include a step of withdrawing the residues of the first and second metal layers present on the substrate to be handled. This withdrawal can be made by selective chemical etching, mechanical-chemical polishing or any other method known to those skilled in the art.

The method can further include a step of recycling the handle substrate, in view of making it able to be reused in such a temporary bonding method.

It will be reminded that both these previous post-detachment steps are much easier and valuable than for techniques using porous or ionically implanted "embrittlable" layers. Indeed, the deposited metal layers can be very thin, and etching these layers is very well controlled by cheap technologies.

Evaluations of the bonding energy have been made by the DCB ("Double Cantilever Beam" or inserting blades) method with bonding made through copper layers with a thickness of 5 µm and 50 nm.

After thermocompression assembly, the bonding energy is 1400 mJ/m$^2$, corresponding to a sufficient energy to resist to a mechanical thinning down to 10 µm residual silicon.

After providing a thermal budget at 400° C. for two hours, the bonding energy is now only 120 mJ/m$^2$, that is a sufficiently low energy to allow for the effortless disassembly "with the nail" at the titanium nitride sub-layer/copper layer interface.

A second possible embodiment of the invention is illustrated by FIGS. 4a-4f. It relates to a substrate to be handled 10 for forming an accommodating substrate (referred to as an "interposer") within the scope of 3D vias to support several electronic chips, in particular heterogeneous chips. The treatment of the substrate to be handled assembled to the handle substrate consists in particular in this embodiment in forming therein through-silicon vias enabling both faces of the "interposer" to be interconnected.

With reference to FIG. 4a, once again there is a handle substrate 30 covered with a continuous metal layer 40, and a substrate to be handled 10 covered with a metal layer 20 which is here a discontinuous layer consisting of a plurality of metal micro-bumps 21-24 distributed on the substrate to be handled 10.

The micro-bumps are obtained according to a conventional method of spreading a thick resin (about 50 µm), photolithography, electrodepositing a metal (about 30 µm), for example copper, developing a resin and then metal chemical etching enabling the desired radius of curvature to be obtained. The article by Banijamali, B. et al. entitled "Advanced Reliability Study of TSV Interposers and Interconnects for the 28 nm Technology FPGA" (IEEE/ECTC, Orlando, Fla., June 2011, pp. 285-290) could be referred to in this regard.

These micro-bumps have a diameter in the order of 5 to 200 µm and are spaced apart at least by a few microns. Besides, the fact that these micro-bumps are made from a thick copper deposition results in grains having a high size (typically higher than 5 µm). Thus, within the scope of this embodiment, the first grain size is higher than the second grain size.

Figures 4A, 4B, 4C:
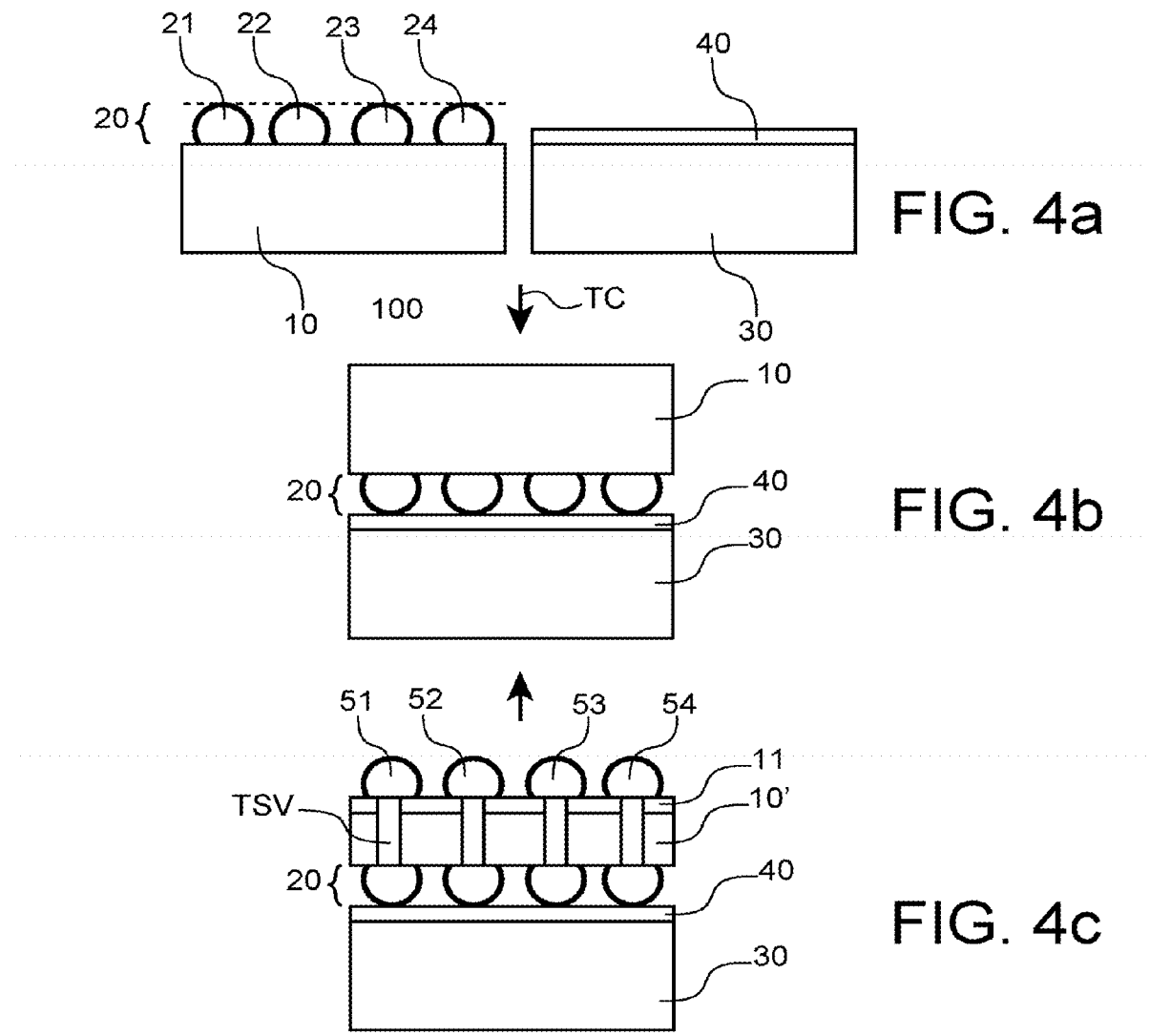
FIGS. 4a-4f are schemes illustrating the different steps of a second possible embodiment of the method according to the invention.

With reference to FIG. 4b, the step of assembling the substrate to be handled 10 and the handle substrate 30 by thermocompression TC assisted direct bonding of the first and second metal layers 20, 40 is then conducted. The temperature is for example 200° C. The pressure applied can be similar to that applied in the first embodiment for continuous layers (in the order of one MPa), which, given the facing surfaces, corresponds to a lower force applied than for continuous layers.

Figure 4D:
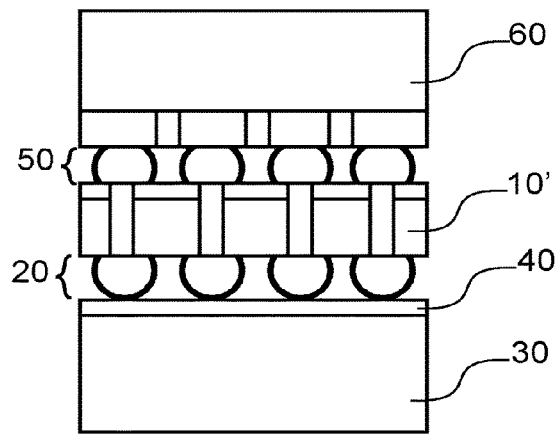

With reference to FIGS. 4c and 4d, a treatment of the substrate to be handled 10 now assembled to the handle substrate 30 is then conducted at temperatures between room temperature and 400° C.

This treatment can comprise thinning the substrate to be handled, for example a mechanical thinning made from the free face of the substrate to be handled opposite to the assembled face of the handle substrate, preferably by controlling the total thickness variation TTV in order to ensure a good homogeneity in thickness. The treatment can be followed by depositing a passivation layer and a dielectric layer 11 onto the thinned substrate to be handled 10', followed by forming through-silicon vias TSV passing through the thinned substrate to be handled. A metal deposition can then be made to form bumps or micro-bumps 51-54 on the free face of the thinned substrate to be handled, wherein these bumps or micro-bumps can be distributed at a pitch whether identical or not to the pitch of the micro-bumps 20-24 of the first metal layer 20.

Then, with reference to FIG. 4d, the treatment of the substrate to be handled assembled to the handle substrate 30 is followed by an assembly to a receiver substrate 60, more precisely of the free face of the thinned substrate to be handled 10', the bumps or micro-bumps 51-54 thereby playing the role of a bonding layer 50 with the receiver substrate 60.

Figure 4E:
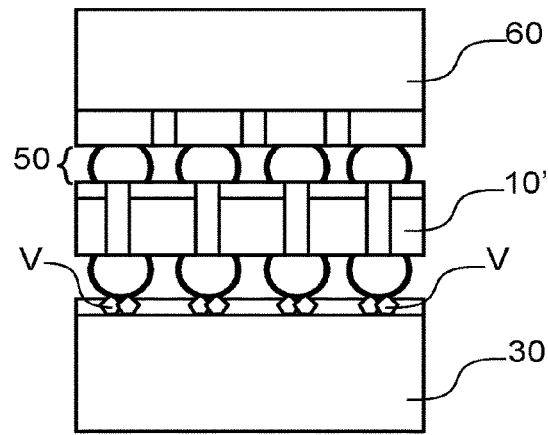

With reference to FIG. 4e, the disassembly of the assembly of the substrate to be handled and the handle substrate is conducted using an embrittlement thermal annealing, for example made at a temperature of 400° C. This annealing gives rise to the vacancies V on the side of the second metal layer 40 which has the lowest grain size, wherein these vacancies come to embrittle the interface between the substrate to be handled and the handle substrate.

Figure 4F:
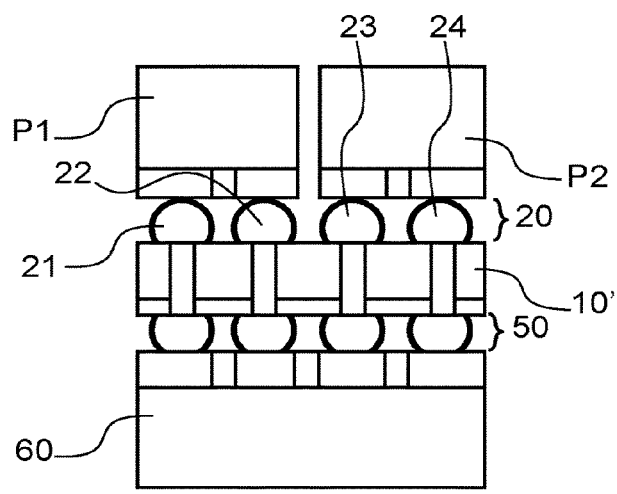

Then, with reference to FIG. 4f, the assembly of the chips P1-P2, being generally heterogeneous, is conducted on the structure formed by the assembly of the thinned substrate to be handled 10' (here playing the role of the accommodating "interposer" substrate), of the bonding layer 50 and the receiver substrate 60, through the micro-bumps 21-24 of the first metal layer 20.

The invention claimed is:

1. A method for manufacturing a structure which implements temporary bonding of a substrate to be handled with a handle substrate, comprising:
   providing the substrate to be handled covered with a first metal layer, the first metal layer having a first grain size;
   providing the handle substrate covered with a second metal layer, the second metal layer having same composition as the first metal layer and a second grain size different from the first grain size;
   assembling the substrate to be handled and the handle substrate by thermocompression assisted direct bonding of the first and second metal layers, said assembling resulting in an assembly which comprises the substrate to be handled assembled to the handle substrate through a bonding layer made of the first and second metal layers bonded together; and
   separating the assembly at an embrittlement zone to form the structure, the separating comprising an embrittlement thermal annealing of the assembly to form the embrittlement zone in one of the first and second metal layers which has the smallest grain size.

2. The method according to claim 1, wherein the first and second grain sizes differ by a factor at least equal to 5.

3. The method according to claim 2, wherein one of the first and second grain sizes is between 20 nm and 100 nm and the other of the first and second grain sizes is between 5 μm and 10 μm.

4. The method according to claim 1, wherein the first metal layer has a thickness different from the second metal layer, the thicknesses of the first and second metal layers differing according to a ratio at least equal to 5.

5. The method according to claim 1, comprising depositing the first and second metal layers on the substrate to be handled and the handle substrate respectively according to different operating conditions.

6. The method according to claim 1, further comprising, before assembling the substrate to be handled and the handle substrate, implementing different crystallization annealings of the substrate to be handled covered with the first metal layer and of the handle substrate covered with the second metal layer.

7. The method according to claim 1, further comprising, before assembling the substrate to be handled and the handle substrate, a surface roughening treatment applied to at least one of the first and second metal layers.

8. The method according to claim 1, wherein the first metal layer is a discontinuous layer including a plurality of metal micro-bumps distributed on the substrate to be handled, the first grain size being higher than the second grain size.

9. The method according to claim 1, further comprising, after separating the assembly, withdrawing residues of the first and second metal layers present on the substrate to be handled.

10. The method according to claim 1, wherein a first metal diffusion barrier layer is interposed between the substrate to be handled and the first metal layer, and a second metal diffusion barrier layer is interposed between the handle substrate and the second metal layer.

11. The method according to claim 1, wherein the first and second metal layers are copper layers, and further comprising, after assembling the substrate to be handled and the handle substrate and before separating, treating the substrate to be handled while assembled to the handle substrate at a temperature higher than 200° C. and lower than the temperature of the embrittlement thermal annealing.

12. The method according to claim 1, wherein the assembly of the substrate to be handled and the handle substrate by thermocompression assisted direct bonding is made at a temperature lower than the temperature of the embrittlement thermal annealing temperature.

13. The method according to claim 1, wherein the first and second metal layers are copper layers, and wherein the embrittlement thermal annealing is made at a temperature higher than or equal to 400° C.

14. The method according to claim 1, wherein the first and second metal layers are refractory metal layers, and wherein the embrittlement thermal annealing of the assembly is made at a temperature higher than or equal to 900° C.

15. The method according to claim 1, further comprising, after assembling the substrate to be handled and the handle substrate and before separating, assembling the substrate to be handled to a receiver substrate.

16. The method according to claim 15, wherein the first metal layer is a discontinuous layer of a plurality of metal micro-bumps distributed on the substrate to be handled, the first grain size being higher than the second grain size, and further comprising, before assembling the substrate to be handled to the receiver substrate, thinning a free face of the substrate to be handled and forming through-silicon vias passing through the thinned substrate to be handled.

17. The method according to claim 1, further comprising, after separating the assembly, recycling the handle substrate.

18. The method according to claim 1, comprising:
   forming a first layer on the handle substrate;
   forming the second metal layer on the first layer; and
   forming voids at an interface between the first layer and the second metal layer.

* * * * *